United States Patent
Sandhu et al.

(10) Patent No.: US 6,214,687 B1
(45) Date of Patent: Apr. 10, 2001

(54) METHOD OF FORMING A CAPACITOR AND A CAPACITOR CONSTRUCTION

(75) Inventors: Gurtej Sandhu; Pierre C. Fazan, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/251,387

(22) Filed: Feb. 17, 1999

(51) Int. Cl.[7] .................................................. H01L 21/20
(52) U.S. Cl. ........................................... 438/396; 438/396
(58) Field of Search ................................. 438/252, 253, 438/255, 396, 397, 398, 964, 254, 947

(56) References Cited

U.S. PATENT DOCUMENTS

| | | |
|---|---|---|
| 4,558,509 | 12/1985 | Tiwari . |
| 4,568,565 | 2/1986 | Gupta et al. . |
| 4,742,018 | 5/1988 | Kimura et al. . |
| 5,005,072 | 4/1991 | Gonzalez . |
| 5,006,481 | 4/1991 | Chan et al. . |
| 5,021,357 | 6/1991 | Taguchi et al. . |
| 5,023,683 | 6/1991 | Yamada . |
| 5,053,351 | 10/1991 | Fazan et al. . |
| 5,061,651 | 10/1991 | Ino . |
| 5,071,781 | 12/1991 | Seo et al. . |
| 5,103,275 | 4/1992 | Miura et al. . |

(List continued on next page.)

OTHER PUBLICATIONS

Temmler, D., "Multilayer Vertical Stacked Capacitors (MVSTC) For 64Mbit and 256Mbig DRAMs", Symposium on VLSI Technology, 1991, pp. 13–14.

Temmler, D., "Multilayer Vertical Stacked Capacitors (MVSTC) For 64Mbit and 256Mbig DRAMs", Article, no date, pp. 13–14.

Ema, T. et al;"3–Dimensional Stacked Capacitor Cell For 16M and 64M DRAMs", MOS Division, Fujitsu Limited, IEEE 1988, pp. 592–595.

Conrad, J.R., et al., "Ion Beam Assisted Coating and Surface Modification With Plasma Source Ion Implantation", J. Vac. Sci. Technol. A 8 (4), Jul./Aug., 1990, 3146–3151.

(List continued on next page.)

*Primary Examiner*—David Nelms
*Assistant Examiner*—David Nhu
(74) *Attorney, Agent, or Firm*—Wells. St. John, Roberts, Gregory & Matkin, P.S

(57) ABSTRACT

A method of forming a capacitor includes, a) providing a node to which electrical connection to a first capacitor plate is to be made; b) then, providing a finned lower capacitor plate in ohmic electrical connection with the node using no more than one photomasking step; and c) providing a capacitor dielectric layer and a conductive second capacitor plate layer over the conductive layer. Such is preferably accomplished by, i) providing a layer of conductive material outwardly of the node; ii) providing a first masking layer over the conductive material layer; iii) etching a first opening into the first masking layer over the node; iv) providing a second masking layer over the first masking layer to a thickness which less than completely fills the first opening; v) anisotropically etching the second masking layer to define a spacer received laterally within the first opening and thereby defining a second opening relative to the first masking layer which is smaller than the first opening; vi) after said anisotropically etching, etching unmasked first masking layer material away; vii) after said anisotropically etching, etching through the conductive material layer to extend the second opening to the node, the node and conductive layer being electrically isolated from one another after the conductive material layer etching; viii) plugging the extended second opening with an electrically conductive plugging material, the plugging material electrically interconnecting the node and conductive layer. Novel capacitor constructions are also disclosed.

4 Claims, 12 Drawing Sheets

U.S. PATENT DOCUMENTS

| | | |
|---|---|---|
| 5,116,776 | 5/1992 | Chan et al. . |
| 5,130,172 | 7/1992 | Hicks et al. . |
| 5,135,883 | 8/1992 | Bae et al. . |
| 5,139,825 | 8/1992 | Gordon et al. . |
| 5,160,987 | 11/1992 | Pricer et al. . |
| 5,164,337 | 11/1992 | Ogawa et al. . |
| 5,168,073 | 12/1992 | Gonzalez et al. . |
| 5,170,233 * | 12/1992 | Liu et al. ............................ 257/308 |
| 5,216,267 | 6/1993 | Jin et al. . |
| 5,223,729 | 6/1993 | Kudoh et al. . |
| 5,290,726 | 3/1994 | Kim . |
| 5,300,321 | 4/1994 | Nakano et al. . |
| 5,320,878 | 6/1994 | Maya . |
| 5,330,614 | 7/1994 | Ahn . |
| 5,403,620 | 4/1995 | Kaesz et al. . |
| 5,464,786 * | 11/1995 | Figura et al. ........................ 437/52 |
| 5,508,218 | 4/1996 | Jun . |
| 5,622,882 | 4/1997 | Yee . |
| 5,631,184 | 5/1997 | Ikemasu et al. . |
| 5,667,222 | 9/1997 | Tseng . |
| 5,684,316 | 11/1997 | Lee . |
| 5,907,170 | 5/1999 | Forbes et al. . |
| 5,930,640 * | 7/1999 | Kenney ................................ 438/396 |
| 5,945,704 | 8/1999 | Schrems et al. . |
| 5,952,688 | 9/1999 | Madan . |
| 5,953,254 | 9/1999 | Pourkeramati . |
| 5,968,686 | 10/1999 | Yamada et al. . |
| 6,025,248 * | 2/2000 | Kim et al. ............................ 438/398 |

OTHER PUBLICATIONS

Niemer, Burkhard, et al., "Organometallic Chemical Vapor Deposition Of Tungsten Metal, And Suppression Of Carbon Incorporation By Codeposition Of Platinum", University of California, Dept. of Chemistry and Biochemistry, May, 1992.

Inoue, S., et al., "A Spread Stacked Capacitor (SSC) Cell For 64 Mbit DRAMs", IEEE 1989, pp. 31–34 (2.3.1–2.3.4).

Morihara, Toshinori, et al., "Disk–Shaped Stacked Capacitor Cell for 256 Mb Dynamic Random–Access Memory", Jpn. J. Appl. Phys., vol. 33 (1994) Pt. 1, No. 8.

Watanabe, Hidehiro,, et al., "Stacked Capacitor Cells for High–Density RAMs", IEDM 88, pp. 600–603.

S.H. Woo,, et al., "Selective Etching Technology of in–situ P Doped Poly–Si (SEDOP) for High Density DRAM Capacitors", IEEE, 1994, pp. 25–26.

Silicon Processing For The VLSI Era (vol. I) Process Technology, Stanley Wolf Ph.D. & Richard N. Tauber Ph.D., 1986, 3 pages.

\* cited by examiner

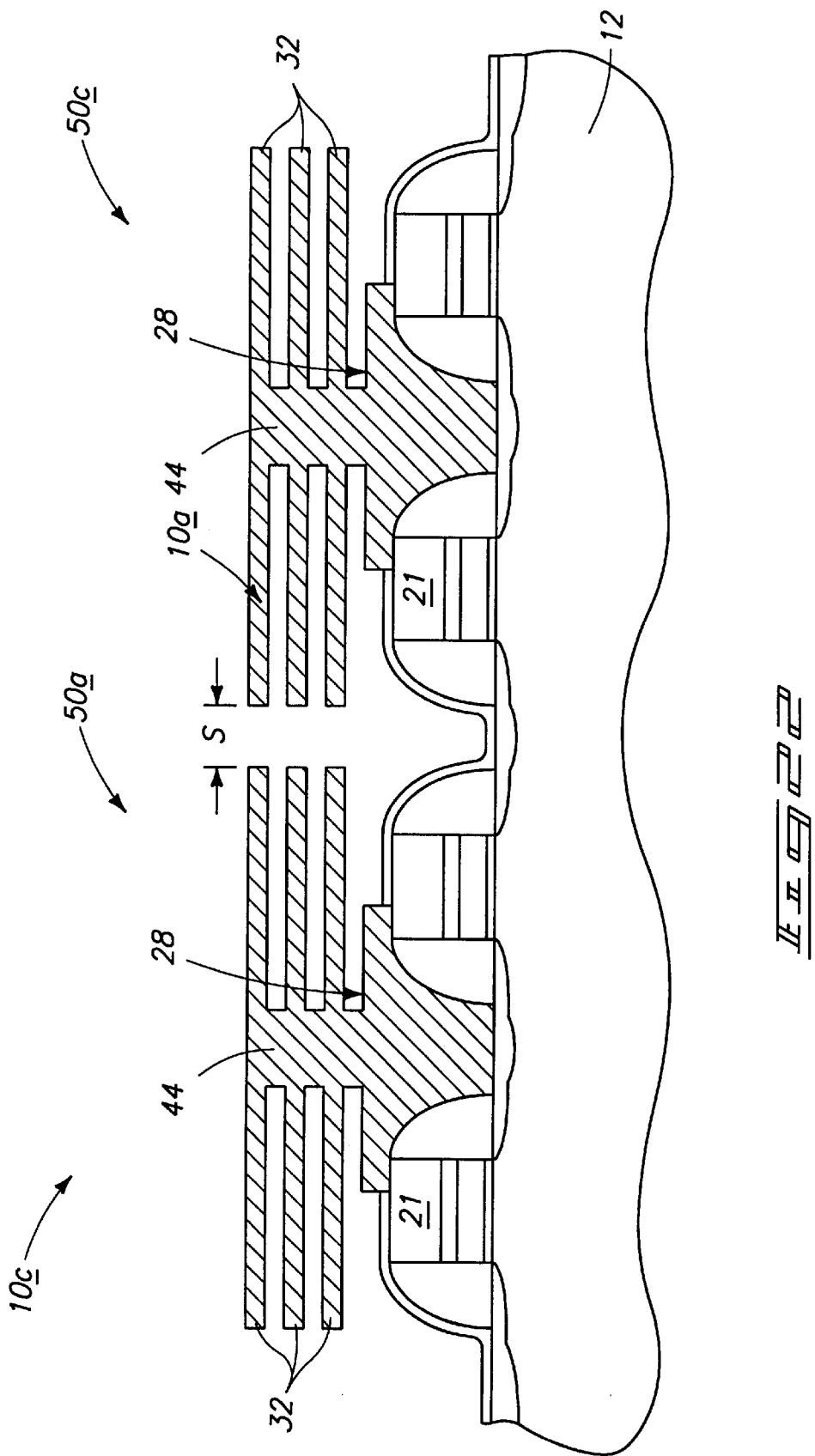

METHOD OF FORMING A CAPACITOR AND A CAPACITOR CONSTRUCTION

RELATED PARENT DATA

This patent resulted from a divisional application of U.S. patent application Ser. No. 08/582,385, which was filed on Jan. 3, 1996.

TECHNICAL FIELD

This invention relates generally to capacitor formation in semiconductor wafer processing, and to resultant capacitor constructions.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area.

The principal way of increasing cell capacitance is through cell structure techniques. Such techniques include three-dimensional cell capacitors, such as trenched or stacked capacitors. This invention concerns stacked capacitor cell constructions, including what are commonly known as crown or cylindrical container stacked capacitors.

BRIEF DESCRIPTION OF THE DRAWINGS

Preferred embodiments of the invention are described below with reference to following accompanying drawings.

FIG. 22 is a diagrammatic sectional view of yet another alternate embodiment semiconductor wafer fragment at a processing step in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor comprises the following steps:

providing a node to which electrical connection to a first capacitor plate is to be made;

after providing the node, providing a finned lower capacitor plate in ohmic electrical connection with the node using no more than one photomasking step; and providing a capacitor dielectric layer and a conductive second capacitor plate layer over the conductive layer.

In accordance with another aspect of the invention, a method of forming a capacitor comprises the following steps:

providing a node to which electrical connection to a first capacitor plate is to be made;

providing a layer of conductive material outwardly of the node;

providing a first masking layer over the conductive material layer;

etching a first opening into the first masking layer over the node;

providing a second masking layer over the first masking layer to a thickness which less than completely fills the first opening;

anisotropically etching the second masking layer to define a spacer received laterally within the first opening and thereby defining a second opening relative to the first masking layer which is smaller than the first opening;

after anisotropically etching the second masking layer, etching unmasked first masking layer material away;

after anisotropically etching the second masking layer, etching through the conductive material layer to extend the second opening to the node, the node and conductive layer being electrically isolated from one another after the conductive material layer etching;

plugging the extended second opening with an electrically conductive plugging material, the plugging material electrically interconnecting the node and conductive layer; and providing a capacitor dielectric layer and a conductive second capacitor plate layer over the conductive layer.

Figure 1:
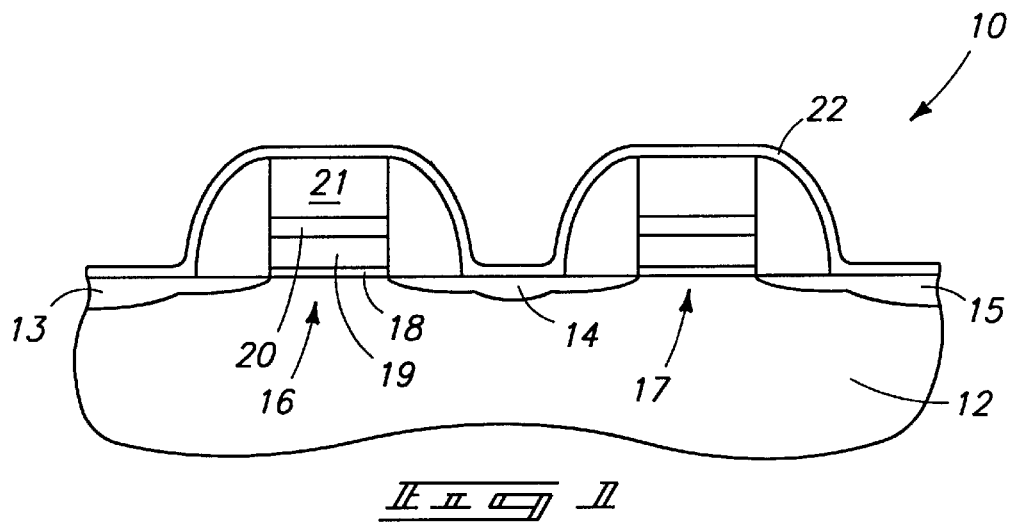
FIG. 1 is a diagrammatic sectional view of a semiconductor wafer fragment at one processing step in accordance with the invention.

Referring to FIG. 1, a semiconductor wafer fragment in process is indicated generally with reference numeral 10.

Such comprises a bulk monocrystalline silicon substrate 12 having diffusion regions 13, 14, 15 provided therein. A pair of word lines 16 and 17 are provided as shown. Such comprise a gate oxide region 18, a polysilicon conductive region 19, a higher conductivity silicide region 20, and an electrically insulative oxide or nitride cap 21. An etch stop layer 22 is provided, to an example thickness of 500 Angstroms. A preferred material for layer 22 is $Si_3N_4$, the optional use of which will be apparent subsequently.

Figure 2:
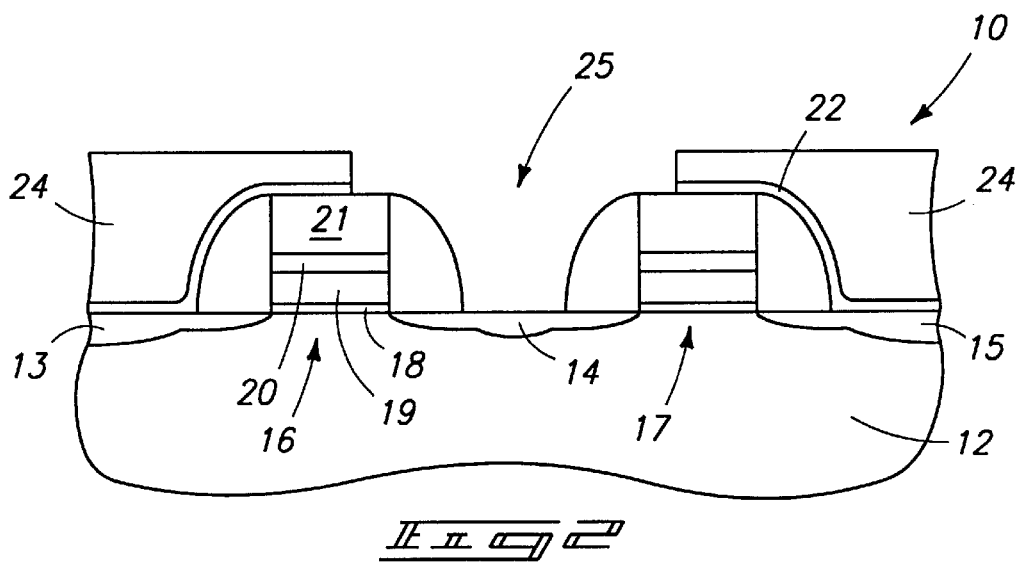
FIG. 2 is a view of the FIG. 1 wafer fragment at a processing step subsequent to that shown by FIG. 1.

Referring to FIG. 2, an insulating dielectric layer 24 is provided over etch stop layer 22. Such is planarized, and a storage node contact 25 opened therethrough to outwardly expose diffusion region 14.

Figure 3:
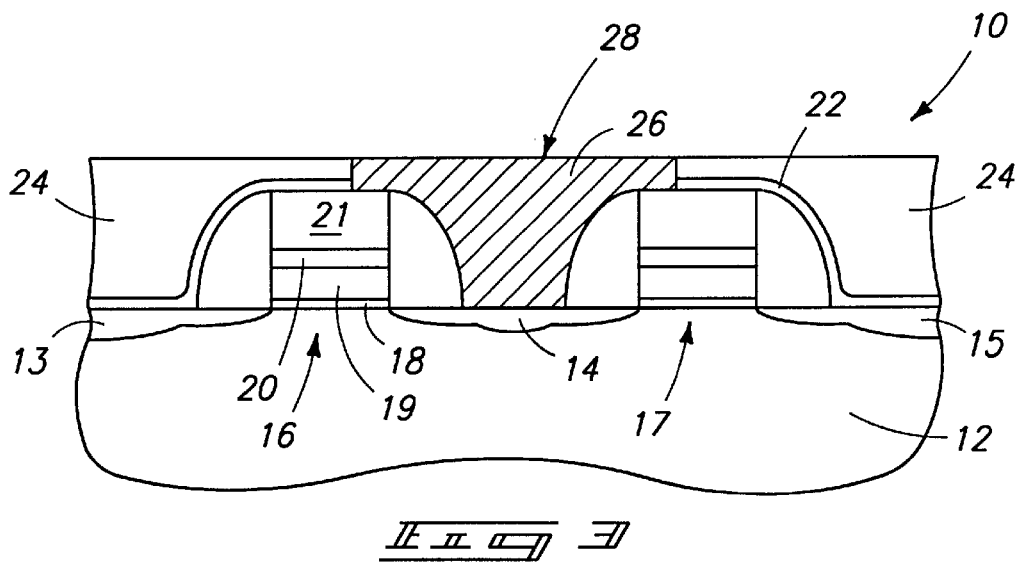
FIG. 3 is a view of the FIG. 1 wafer fragment at a processing step subsequent to that shown by FIG. 2.

Referring to FIG. 3, a layer of conductive material is deposited and planarized back relative to oxide layer 24 to define a pillar 26 which projects from diffusion region 14 provided in bulk semiconductive substrate 12. For purposes of the continuing discussion, pillar 26 comprises an outer surface 28 which constitutes a node to which electrical connection to a first capacitor plate is to be made. An example preferred plugging material 26 is conductively doped polysilicon.

Figure 4:
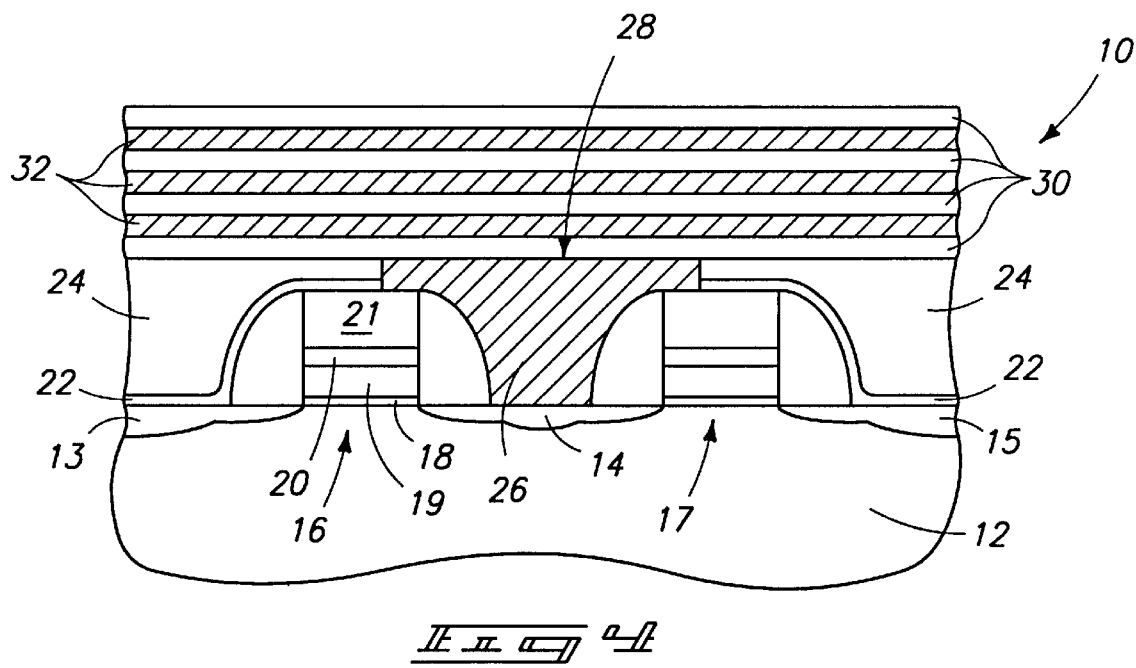
FIG. 4 is a view of the FIG. 1 wafer fragment at a processing step subsequent to that shown by FIG. 3.

Referring to FIG. 4, a plurality of alternating first layers 30 and second layers 32 are provided outwardly relative to node 28. Example and preferred thicknesses for layers 30 and 32 are from 200 Angstroms to 700 Angstroms. The material of first layers 30 is chosen to be selectively etchable relative to node 28, and also to material of second layer 32. An example and preferred material for layers 30 is undoped $SiO_2$ deposited by decomposition of tetraethylorthosilicate (TEOS). Second layer material 32 is chosen to be selectively etchable relative to first layer material 30 and also be electrically conductive. An example and preferred material for layer 32 is conductively doped polysilicon, with the material of layer 32 and plugging material 26 in the preferred embodiment thereby constituting the same material. Further, the first layer material 30 is preferably entirely sacrificial, but nevertheless preferably constitutes an electrically insulative material. The alternating stack of first and second layers 30 and 32 are shown as terminating in an upper layer 30, although an upper layer 32 could ultimately be provided.

Figure 5:
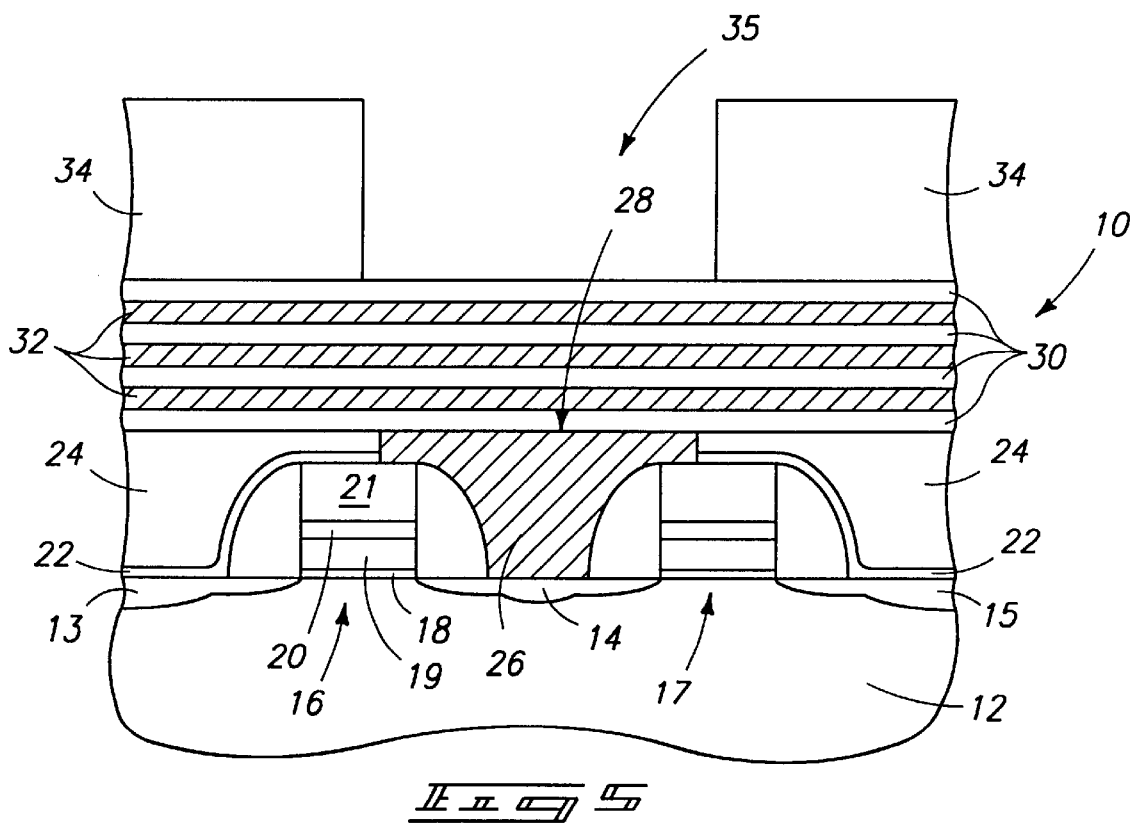
FIG. 5 is a view of the FIG. 1 wafer fragment at a processing step subsequent to that shown by FIG. 4.

Referring to FIG. 5, a first masking layer 34 is provided over the alternating layers 30 and 32, and thus over and outwardly relative to second layer material 32. In the described and preferred embodiment a plurality of alternating layers 30 and 32 are provided for production of a multi-finned capacitor construction as will be apparent subsequently. In accordance with one alternate aspect of the invention, only a single first layer 30 and a single second layer 32 might be utilized. A first opening 35 is etched into first masking layer 34 over node 28. An example and preferred material for layer 34 is a doped oxide deposited to an example thickness of 2,000 Angstroms.

Figure 6:
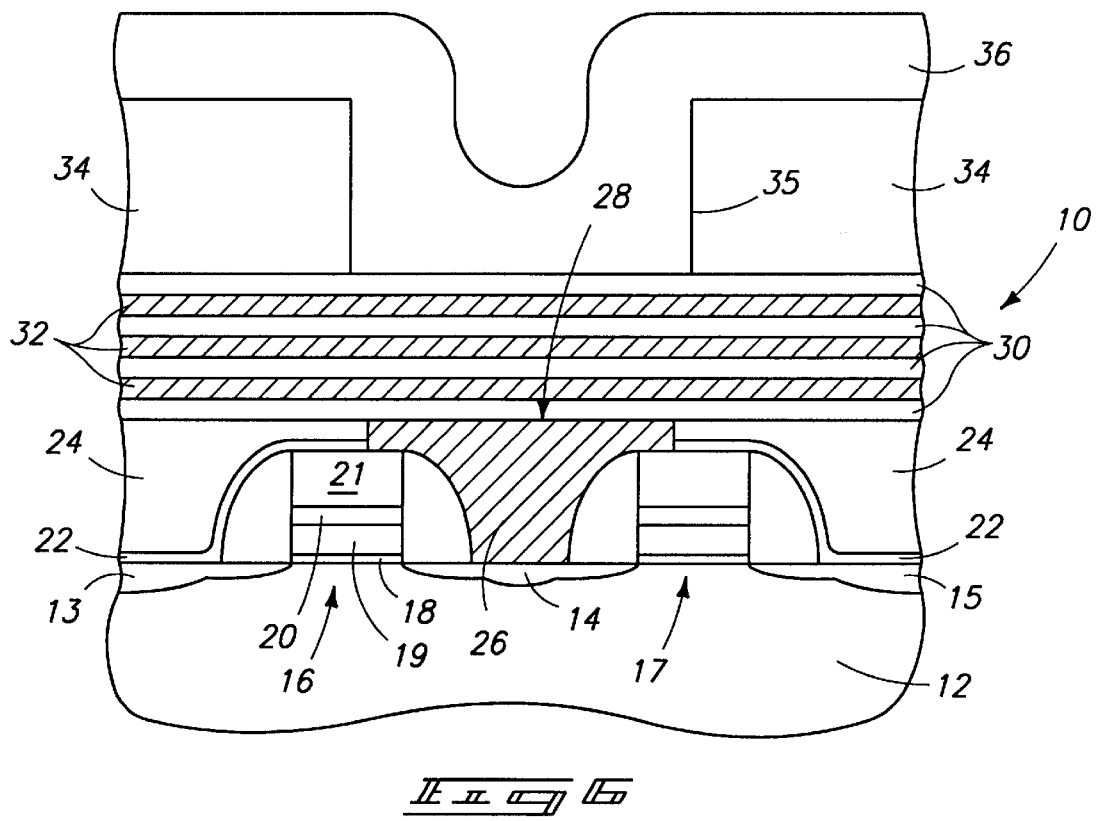
FIG. 6 is a view of the FIG. 1 wafer fragment at a processing step subsequent to that shown by FIG. 5.

Referring to FIG. 6, a second masking layer 36 is provided over first masking layer 34 to a thickness which less than completely fills first opening 35. An example and preferred material for layer 36 is $Si_3N_4$.

Figure 7:
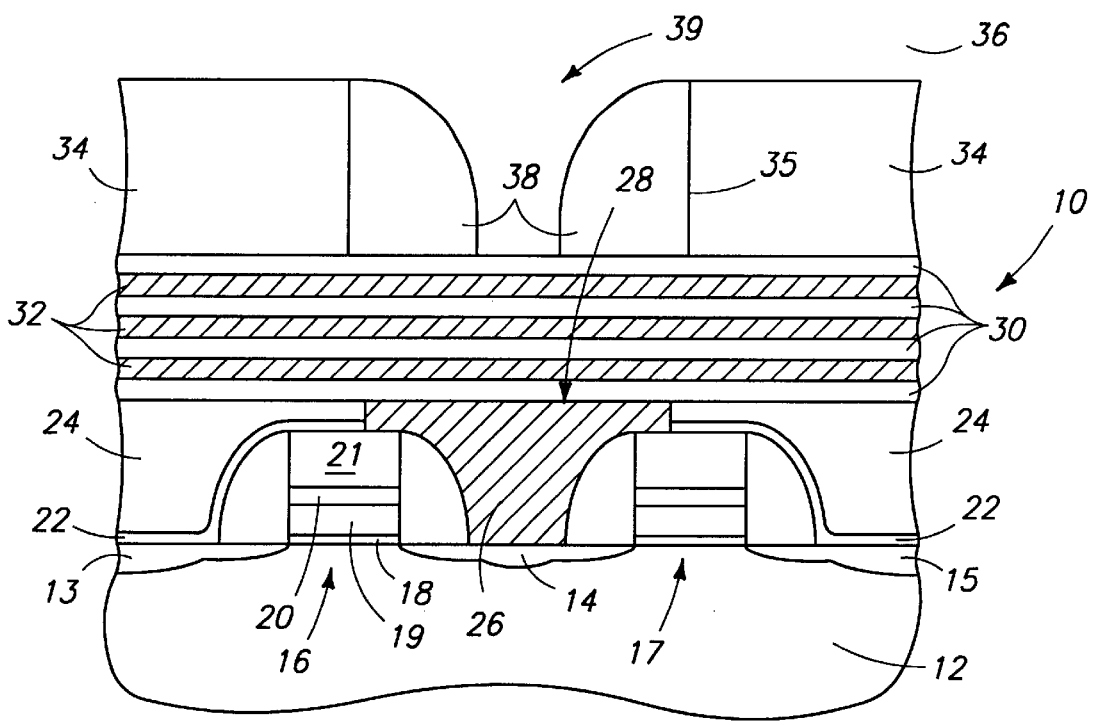
FIG. 7 is a view of the FIG. 1 wafer fragment at a processing step subsequent to that shown by FIG. 6.

Referring to FIG. 7, second masking layer 36 is anisotropically etched to define a spacer 38 received laterally within first opening 35, and thereby defining a second opening 39 relative to first masking layer 34 which is smaller than first opening 35.

Figure 8:
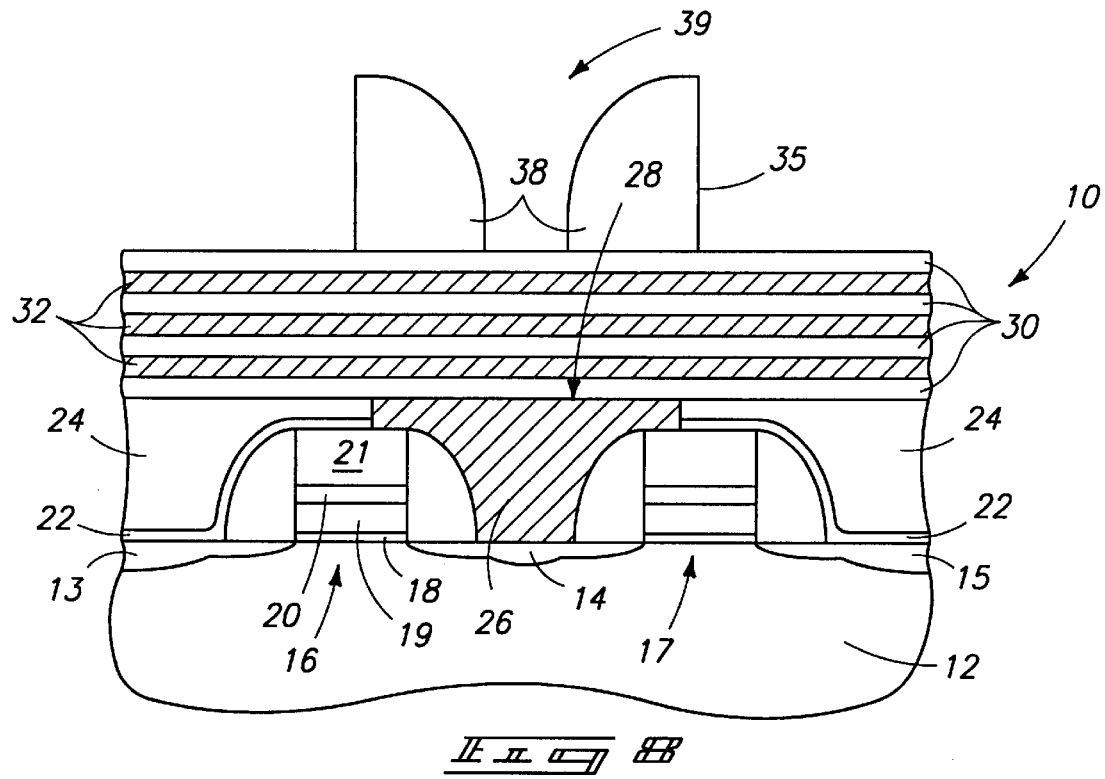
FIG. 8 is a view of the FIG. 1 wafer fragment at a processing step subsequent to that shown by FIG. 7.

Referring to FIG. 8, unmasked first layer material 34 has been etched away. An example etch for stripping layer 34 where it comprises borophosphosilicate glass (BPSG), layer 30 comprises undoped $SiO_2$ and spacer 38 comprises $Si_3N_4$ comprises a wet etch with a HF solution.

Figure 9:
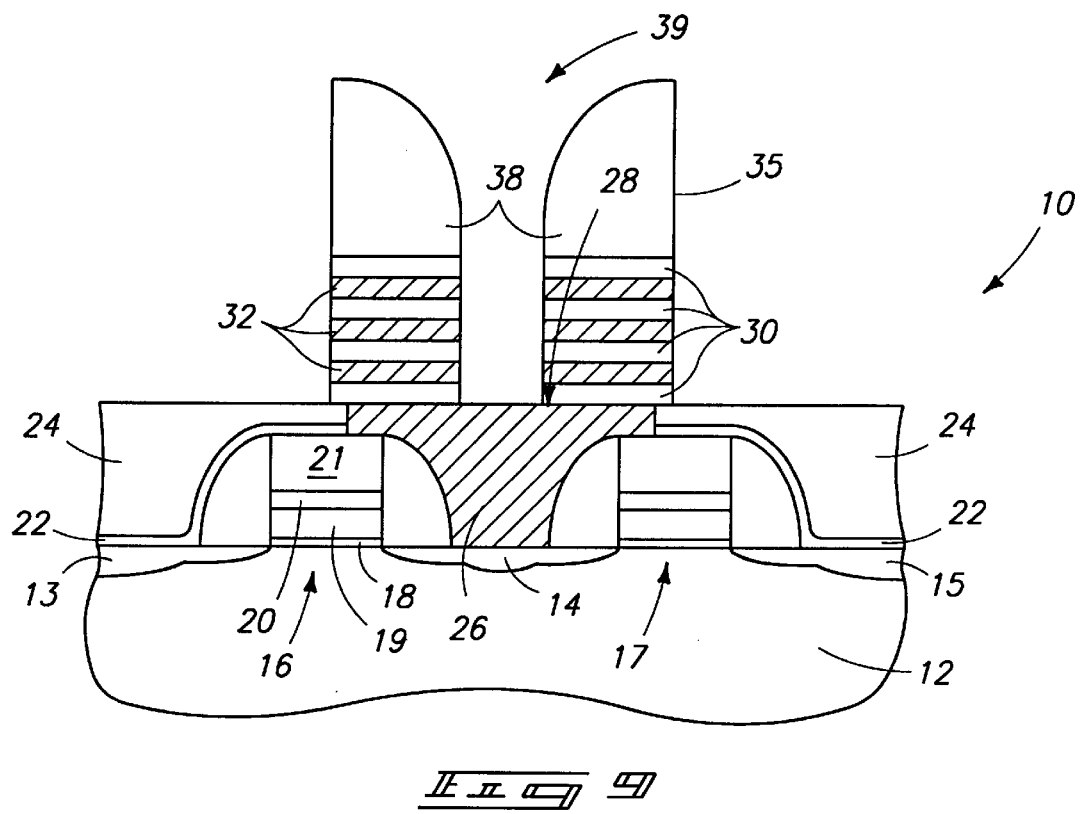
FIG. 9 is a view of the FIG. 1 wafer fragment at a processing step subsequent to that shown by FIG. 8.

Referring to FIG. 9, and with spacer 38 in place, the alternating layers 30 and 32 are etched as shown to define a desired outline (as will be apparent subsequently) of a first capacitor plate and to extend second opening 39 through such alternating layers to node 28. Such etching is preferably conducted for both layers to be highly anisotropic as shown and conducted such that each alternating etch is selective relative to the immediate underlying layer. During such collective etching, spacer 38 constitutes an etching mask. Where spacer 38 comprises $Si_3N_4$, layers 30 comprise undoped $SiO_2$, and layers 32 comprise conductively doped polysilicon, an example etch which will remove such oxide selectively relative to the nitride and polysilicon is using a fluorine and hydrocarbon plasma chemistry which is preferably carbon rich. For the same materials, an example etch which will anisotropically and selectively remove polysilicon of layer 32 anisotropically and selectively relative to nitride and $SiO_2$ is chlorine and HBr plasma.

Such etching effectively defines the illustrated etched layers 32 to constitute a plurality of laterally projecting electrically conductive first capacitor plate fins. The illustrated etch stopping effect relative to insulating layer 24 will not occur where the material of first layers 30 and layer 24 are the same, but will occur where the etch characteristics of layers 30 and 24 can be conducted differently relative to one another.

Figure 10:
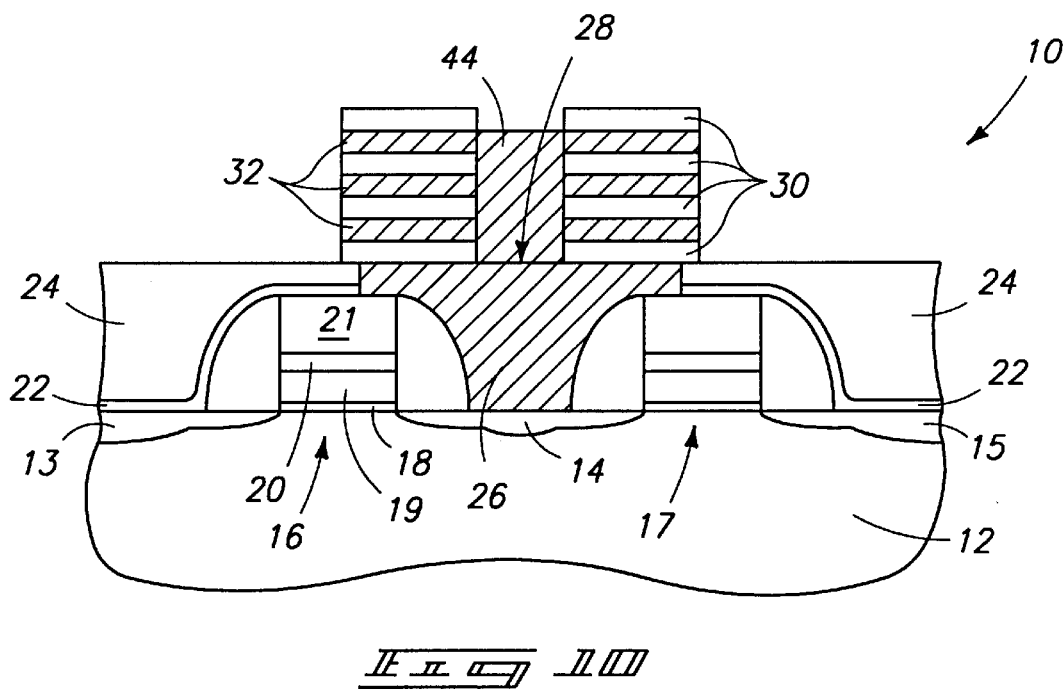
FIG. 10 is a view of the FIG. 1 wafer fragment at a processing step subsequent to that shown by FIG. 9.

Referring to FIG. 10, spacer 38 has been etched away, and an electrically conductive plugging material 44 provided within second opening 39. Accordingly, plugging material 44 electrically interconnects node 28 with the illustrated plurality of second layers/fins 32. An example and preferred technique for providing such layer is to deposit a polycrystalline layer to fill the void and subsequently conduct an anisotropic polycrystalline etch selective to oxide using chlorine and HBr plasma chemistry. Thus in a most preferred embodiment, the material of node 28, plugging material 44 and second layer material 32 all constitute the same material.

Figure 11:
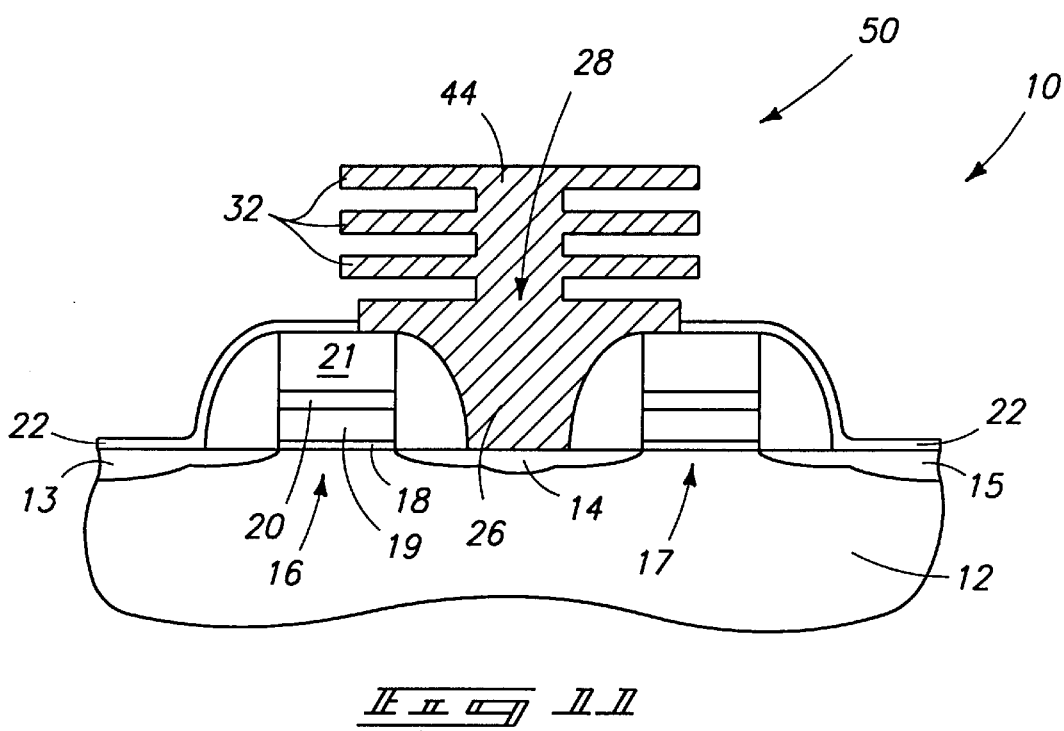
FIG. 11 is a view of the FIG. 1 wafer fragment at a processing step subsequent to that shown by FIG. 10.

Referring to FIG. 11, first layer material 30 is selectively isotropically etched relative to second layer material 32. Preferably, the material of layers 30 and 24 constitutes the same material such that etching of layer 24 also occurs, with etch stop layer 22 acting as an etch stop relative to the word lines and bulk substrate as shown. Where layers 24 and 30 constitute undoped $SiO_2$, an example etching chemistry is an HF solution. The preferred result is the illustrated multi, horizontally finned lower capacitor plate 50 which is effectively in ohmic electrical connection relative the node 28.

Figure 12:
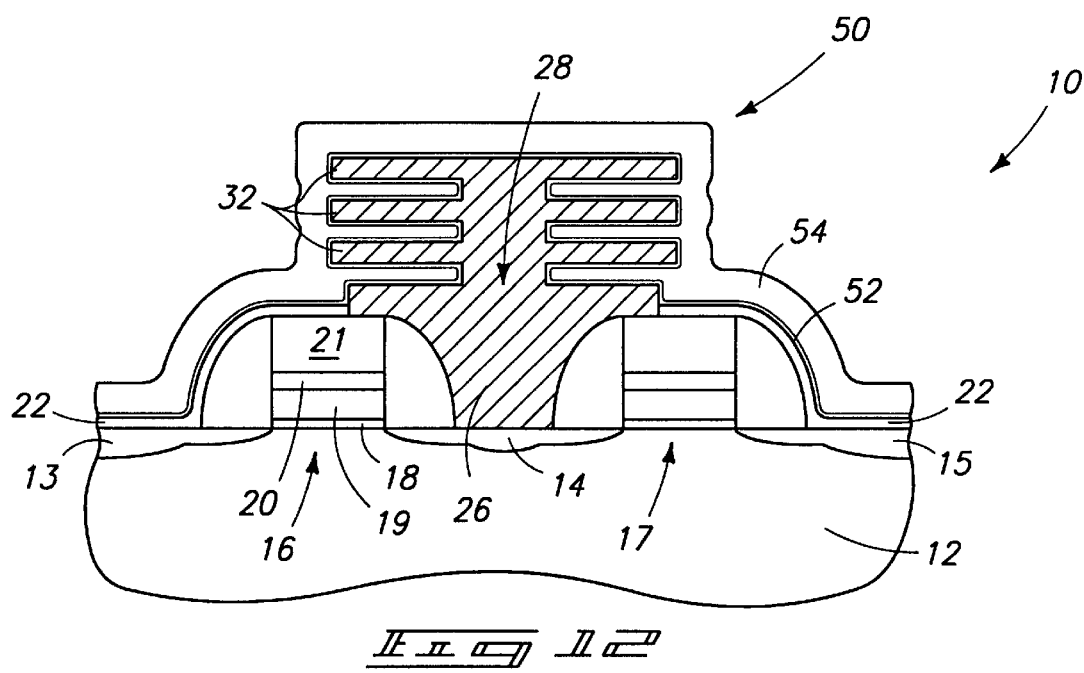
FIG. 12 is a view of the FIG. 1 wafer fragment at a processing step subsequent to that shown by FIG. 11.

Referring to FIG. 12, a capacitor dielectric layer 52 and a subsequent electrically conductive second capacitor plate layer 54 are provided over the illustrated conductive second layers/fins 32 of first capacitor plate 50. This constitutes but one example of forming a capacitor utilizing no more than one photomasking step in producing a finned (preferably multi finned) lower capacitor plate in ohmic electrical connection after providing a node for connection thereto.

In contradistinction to the prior art, only one photomasking step (that to form first opening 35) has been utilized to define all of first capacitor plate 50 between the step of providing node 28 and subsequent steps wherein capacitor dielectric and second conductive plates are provided. Further, the stem/plug 44 diameter can be provided to be less than the minimum photolithograpic feature size/dimension due to the maskless anisotropic etch by which the void for the plug is formed. Thus, more of the available capacitor volume can be consumed by surface-area-enhancing fins than from the stem or plug 44.

Figure 13:
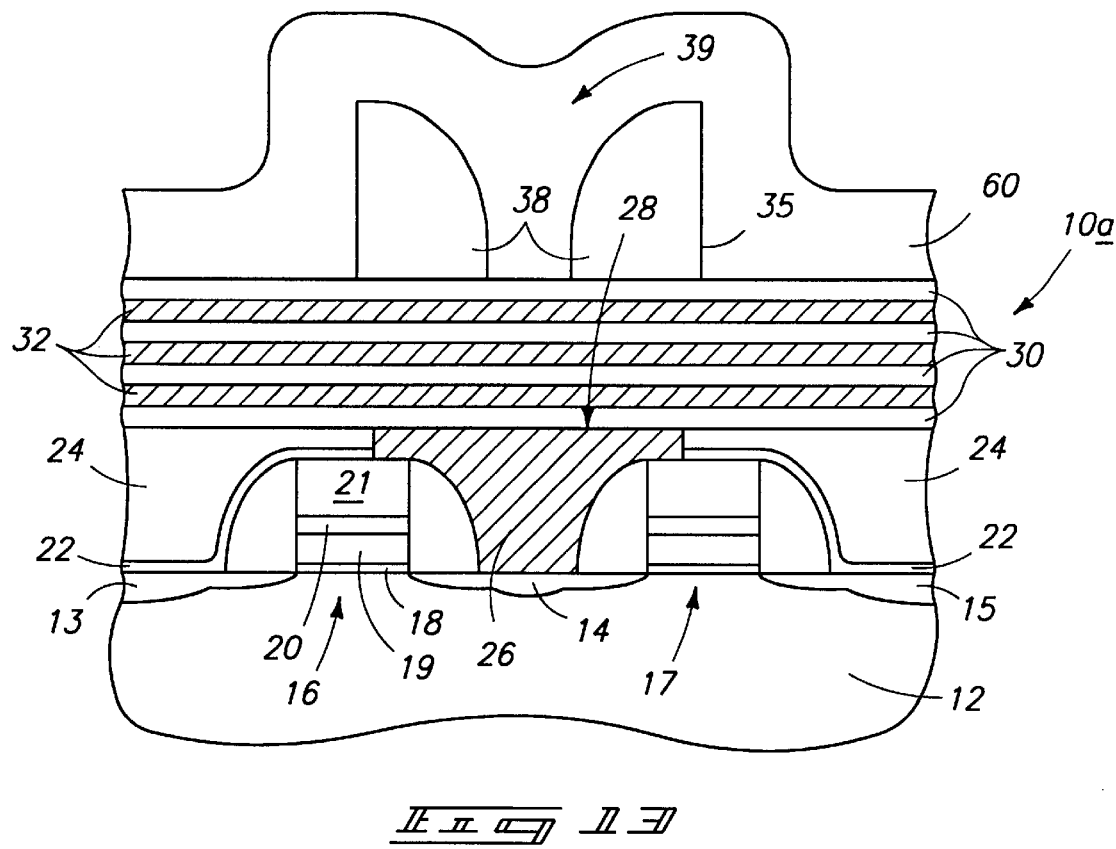
FIG. 13 is a diagrammatic sectional view of an alternate embodiment semiconductor wafer fragment at a processing step in accordance with the invention.

An example alternate embodiment is described with reference to FIGS. 13–16. Like numerals from the first described embodiment are utilized where appropriate, with differences being indicated by the suffix "a" or with different numerals. FIG. 13 illustrates a wafer fragment 10a at a processing step immediately subsequent to that depicted by FIG. 8 in the first described embodiment. Here, a third masking layer 60 is provided over spacer 38. Layer 60 can be the same as or different from the material of layer 38.

Figure 14:
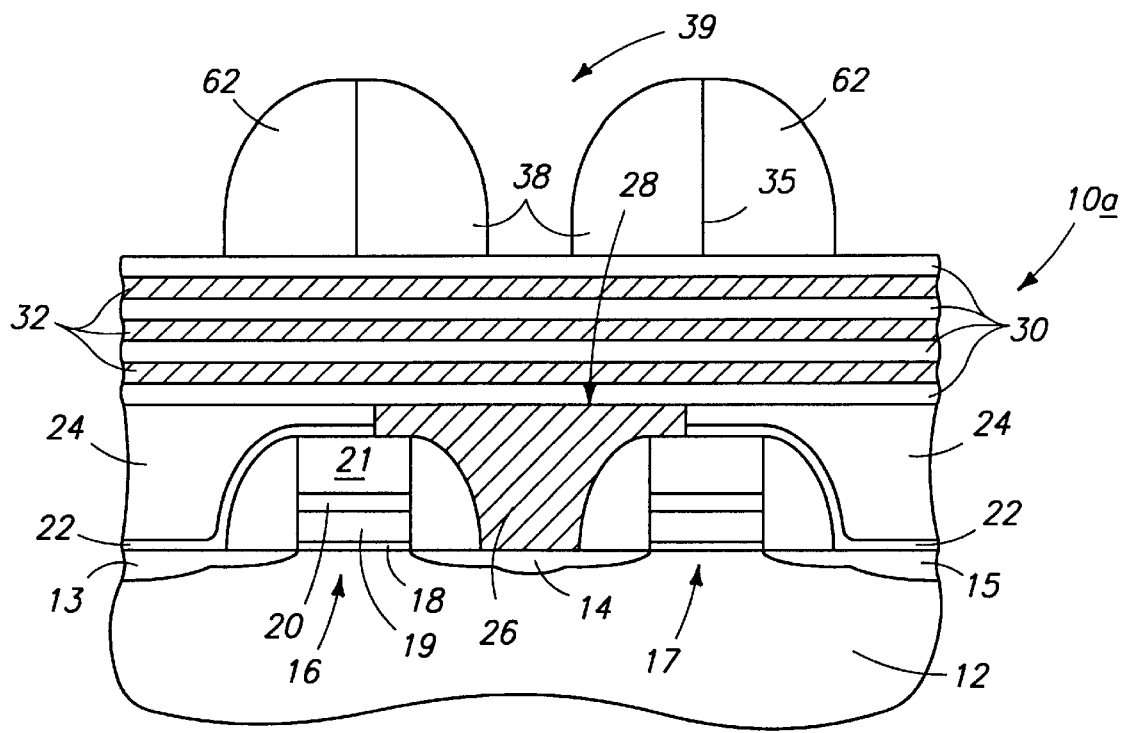
FIG. 14 is a view of the FIG. 13 wafer fragment at a processing step subsequent to that shown by FIG. 13.

Referring to FIG. 14, third masking layer 60 is anisotropically etched to form a secondary spacer 62 laterally outward of first stated spacer 38.

Figure 15:
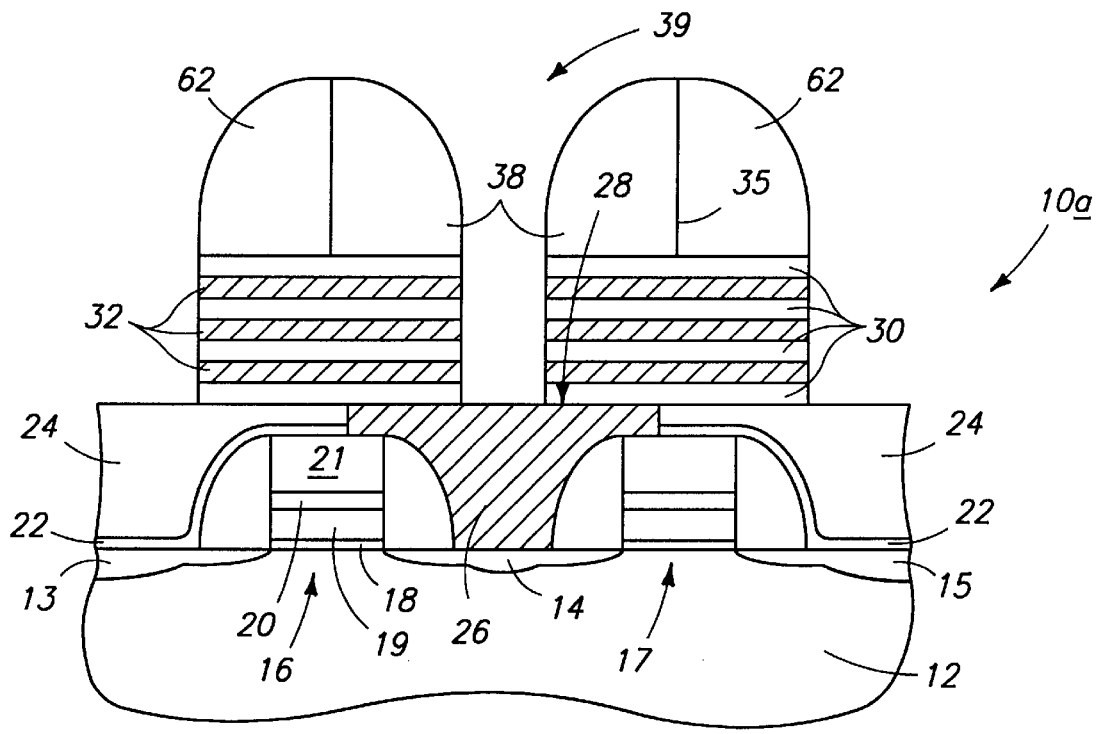
FIG. 15 is a view of the FIG. 13 wafer fragment at a processing step subsequent to that shown by FIG. 14.

Referring to FIG. 15, spacers 62 and 38 are used collectively as an etching mask during the second and first layer etchings to produce the modified construction which extends considerably further laterally outward beyond the boundaries of the first described embodiment capacitor. The same above example etch chemistries can be utilized for effecting the FIG. 15 etch construction where layer 62 comprises BPSG.

Figure 16:
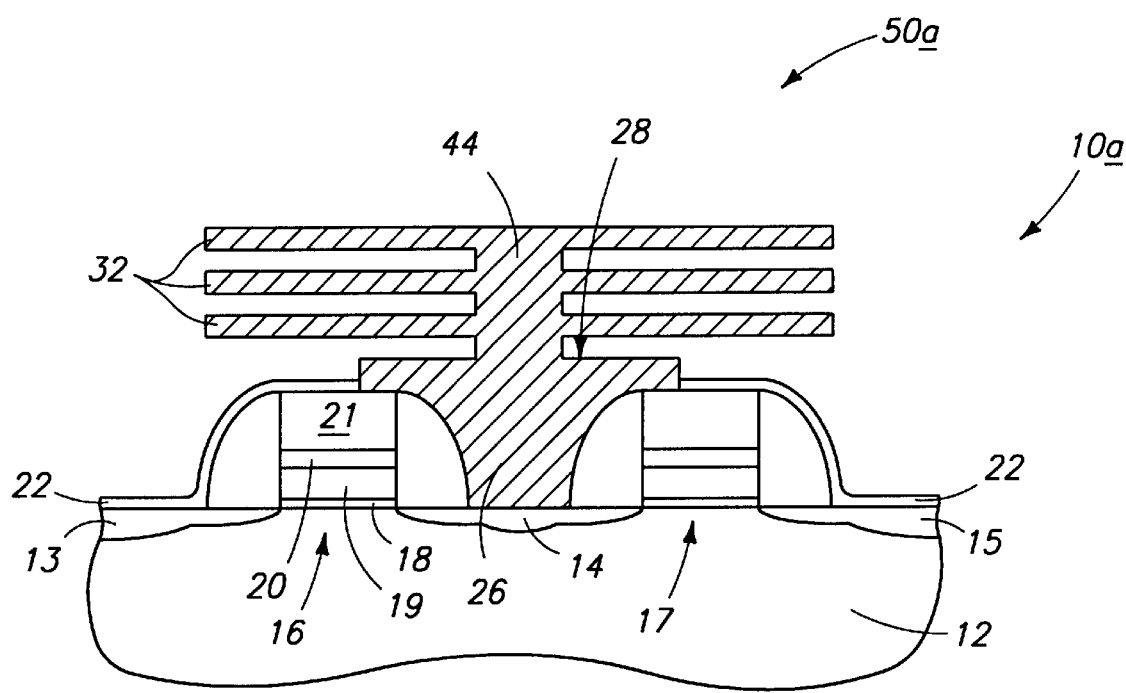
FIG. 16 is a view of the FIG. 13 wafer fragment at a processing step subsequent to that shown by FIG. 15.

Referring to FIG. 16, spacers 62 and 38 etched away, polysilicon plugging material 44 is provided, and first layers 30 are isotropically etched, thus resulting in the modified illustrated first capacitor plate construction 50a.

The above described alternate processing enables placement of adjacent capacitors of a DRAM array closer to one another than the minimum available photolithographic feature size. Prior art processing typically provides the closest spacing between adjacent capacitor edges as being the minimum available photolithographic feature width. In accordance with the above described alternate preferred embodiment, closer placement of such capacitor edges may be possible due to the outer capacitor plate edge being defined by a photolithographic feature at its minimum feature. Accordingly, the mask utilized to produce the mask opening which produces the first corresponding opening of the adjacent capacitor can be placed closer to the edge of the adjacent opening of the described and illustrated capacitor. Such is shown by way of example in FIG. 22 with respect to a wafer fragment 10c. A pair of finned capacitors 50a and 50c are shown separated by a spacing "s", which can be less than the minimum available photolithographic feature size.

Figure 17:
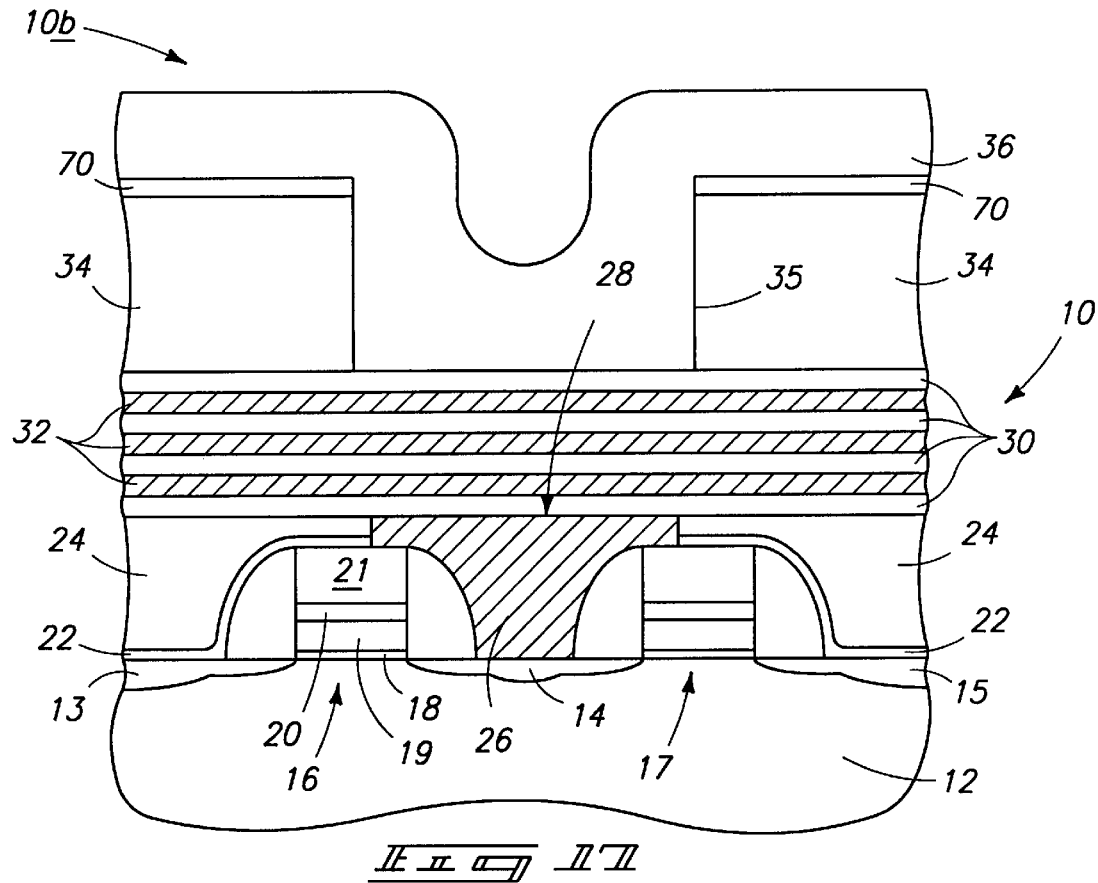
FIG. 17 is a diagrammatic sectional view of another alternate embodiment semiconductor wafer fragment at a processing step in accordance with the invention.
Figure 18:
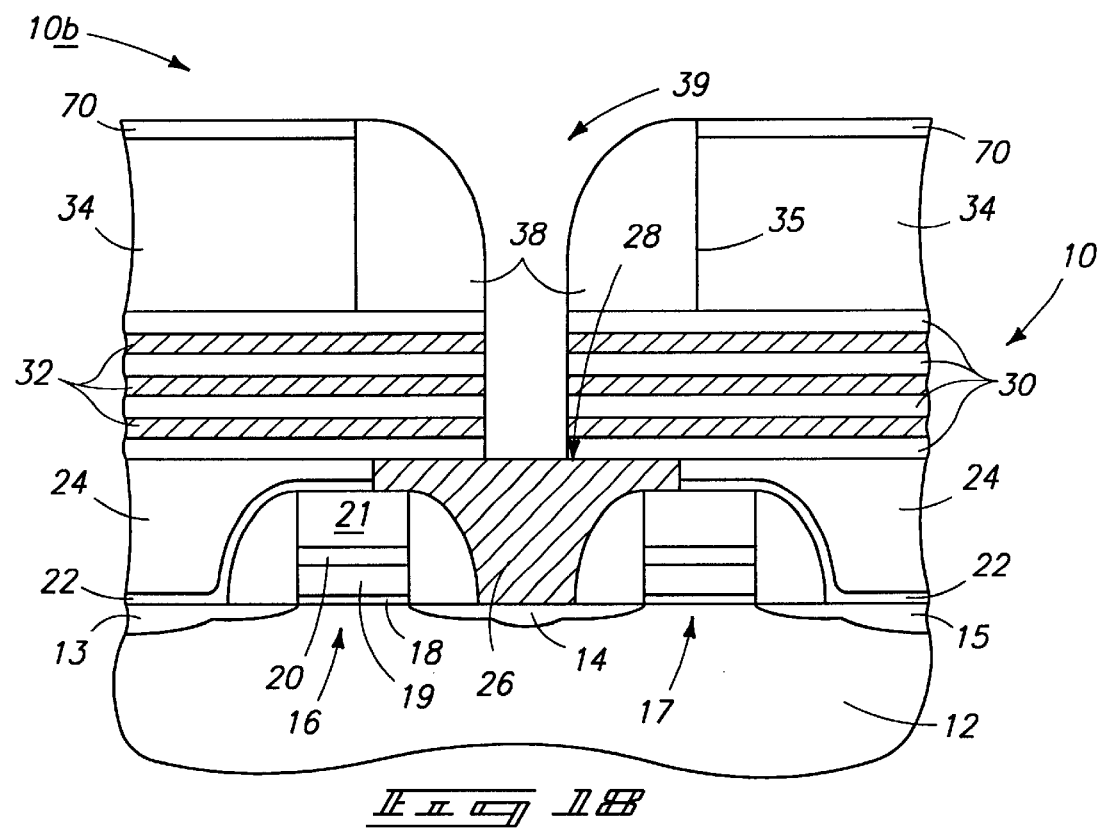
FIG. 18 is a view of the FIG. 17 wafer fragment at a processing step subsequent to that shown by FIG. 17.

Yet another alternate embodiment method is described with reference to FIGS. 17–21. Like numerals from the first described embodiment are utilized where appropriate, with differences being indicated by the suffix "b" or with different numerals. FIG. 17 is the same as FIG. 6, but for provision of an additional masking layer 70 over first masking layer 34. Layer 70 is preferably provided where layers 30 and 34 constitute the same material, as will be apparent from FIG. 18. As there shown, anisotropic etching of second masking layer 36 has occurred to form second opening 39, with subsequent etching of layers 30 and 32 having been conducted to extend such opening to node 28. During such extension etching, layer 34 remains in place with additional masking layer 70 restricting etching of layer 34 while layers 30 are being etched.

Figure 19:
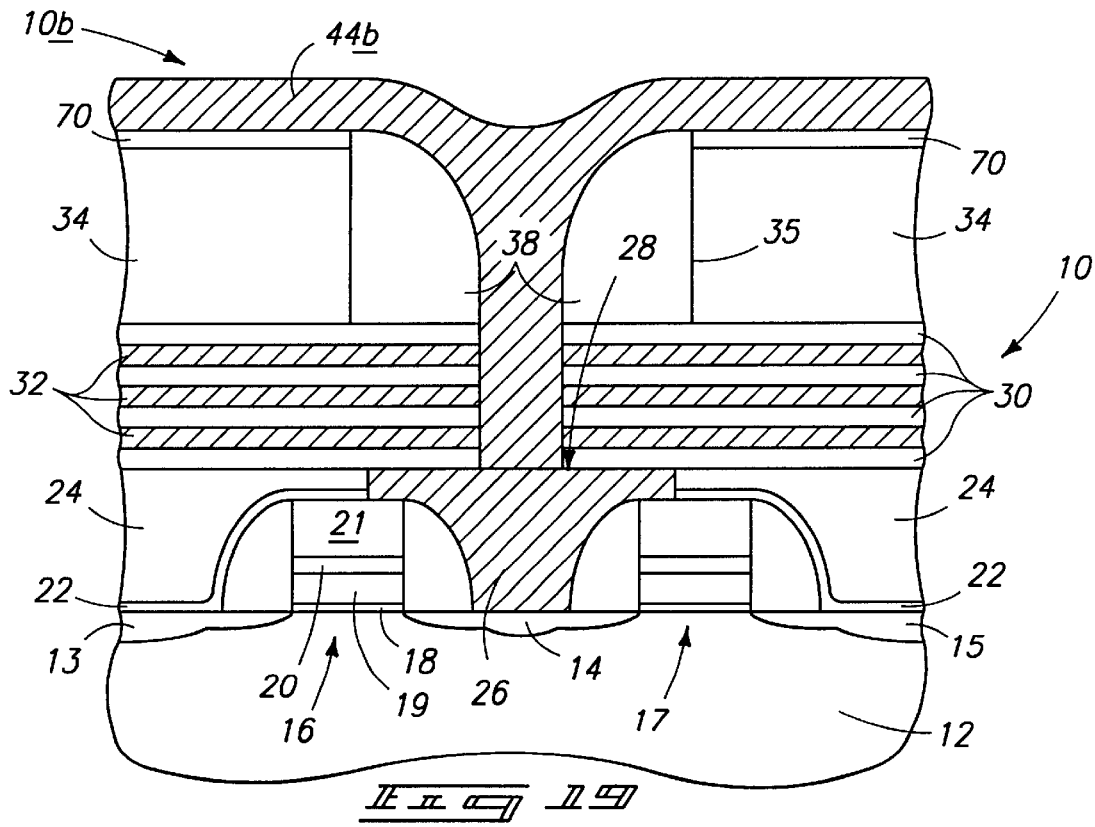
FIG. 19 is a view of the FIG. 17 wafer fragment at a processing step subsequent to that shown by FIG. 18.
Figure 20:
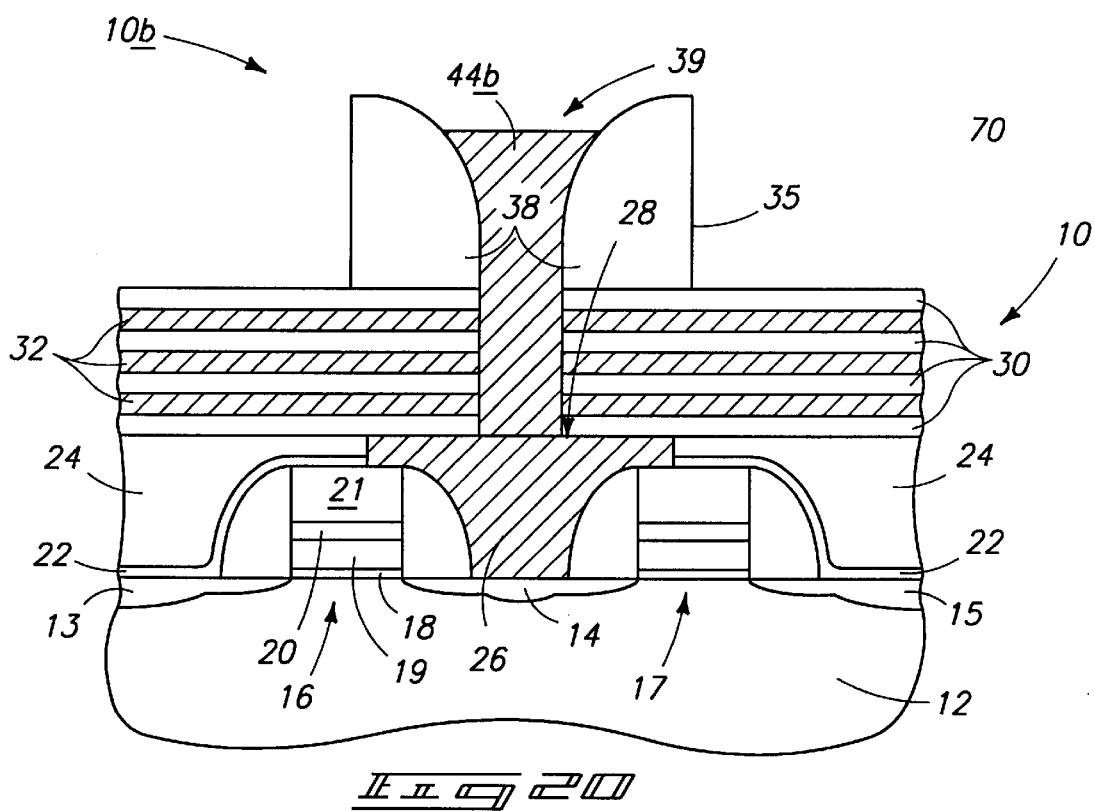
FIG. 20 is a view of the FIG. 17 wafer fragment at a processing step subsequent to that shown by FIG. 19.
Figure 21:
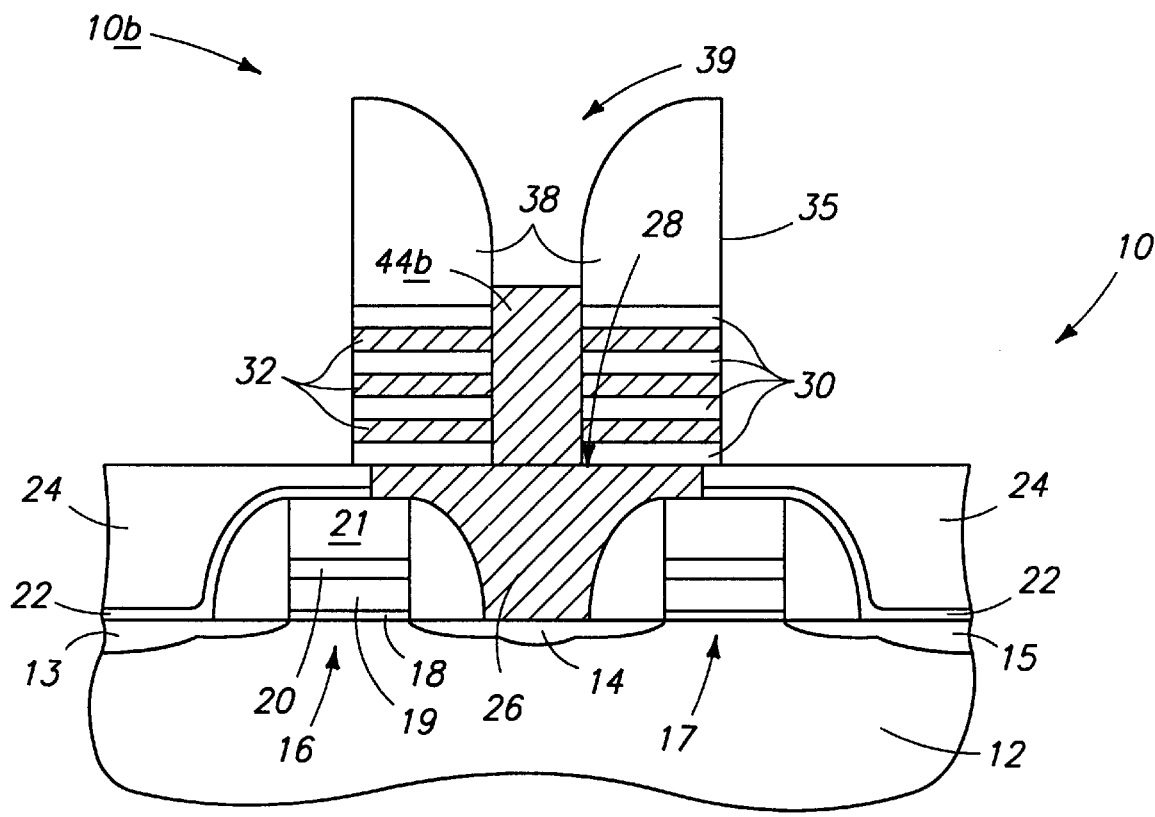
FIG. 21 is a view of the FIG. 17 wafer fragment at a processing step subsequent to that shown by FIG. 20.
Figure 19:
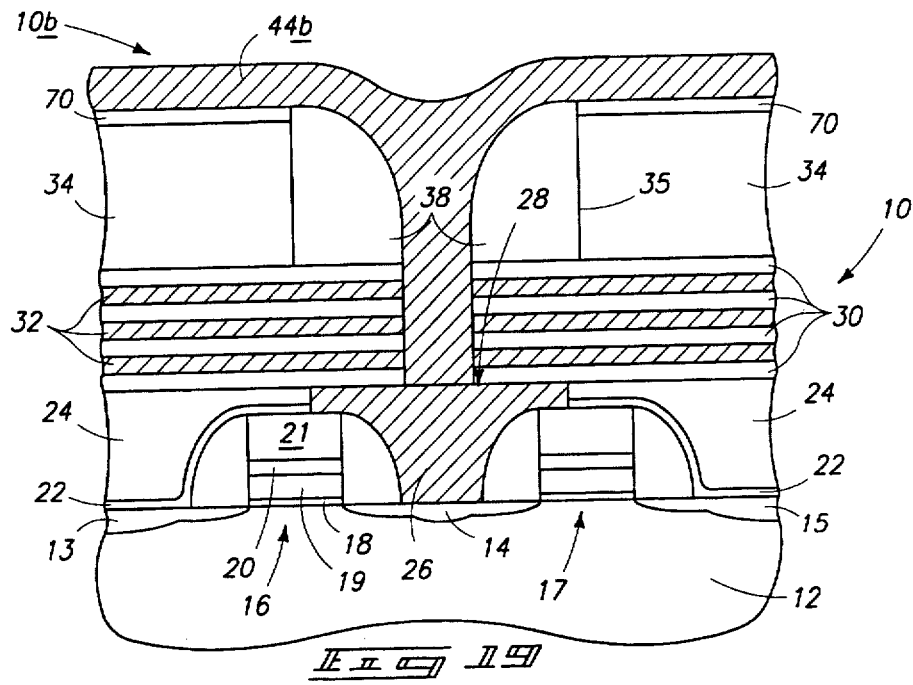
Figure 20:
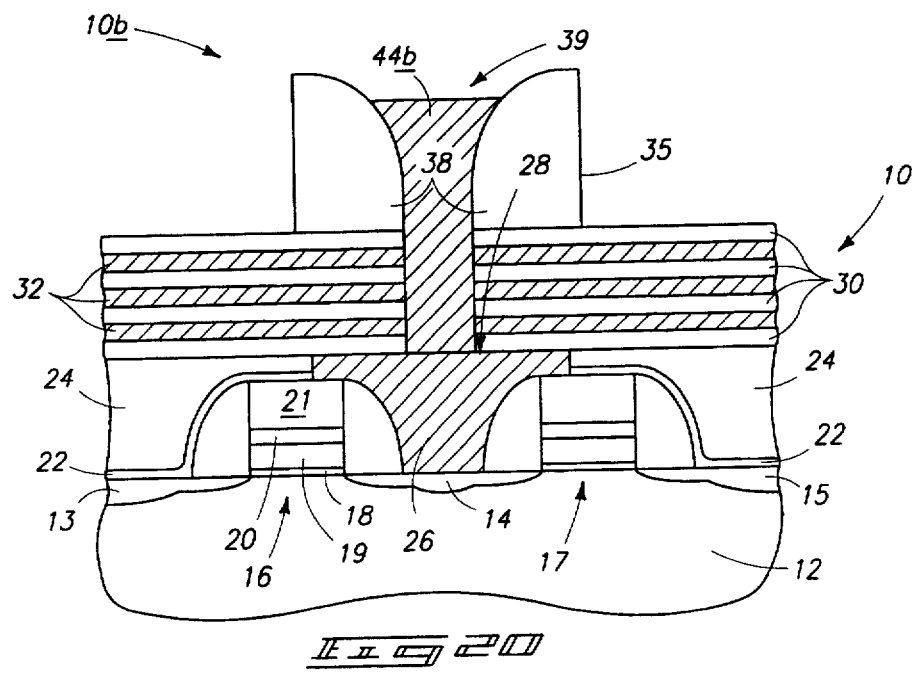
Figure 19:
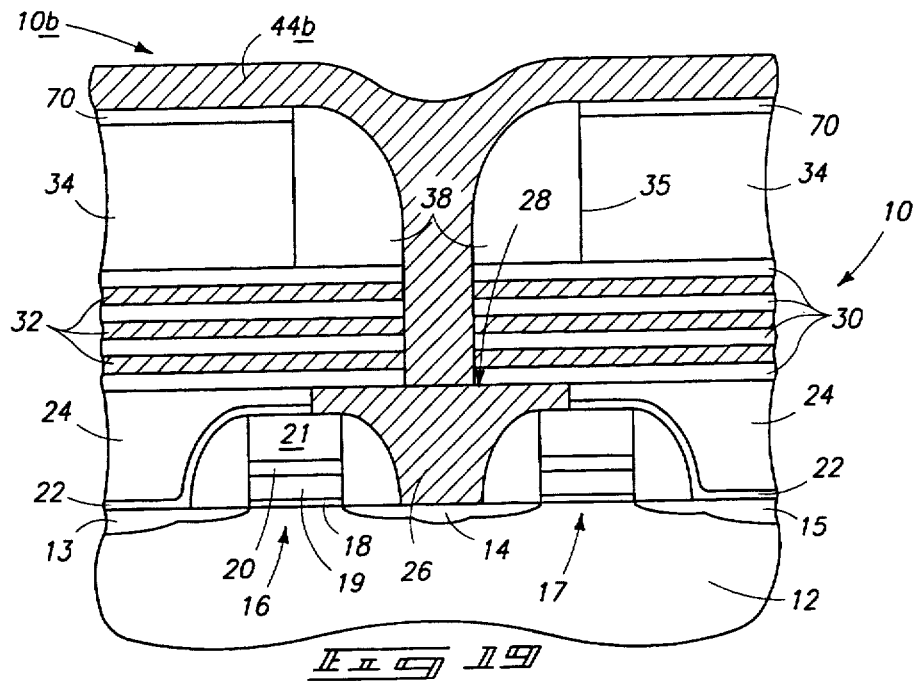
Figure 20:
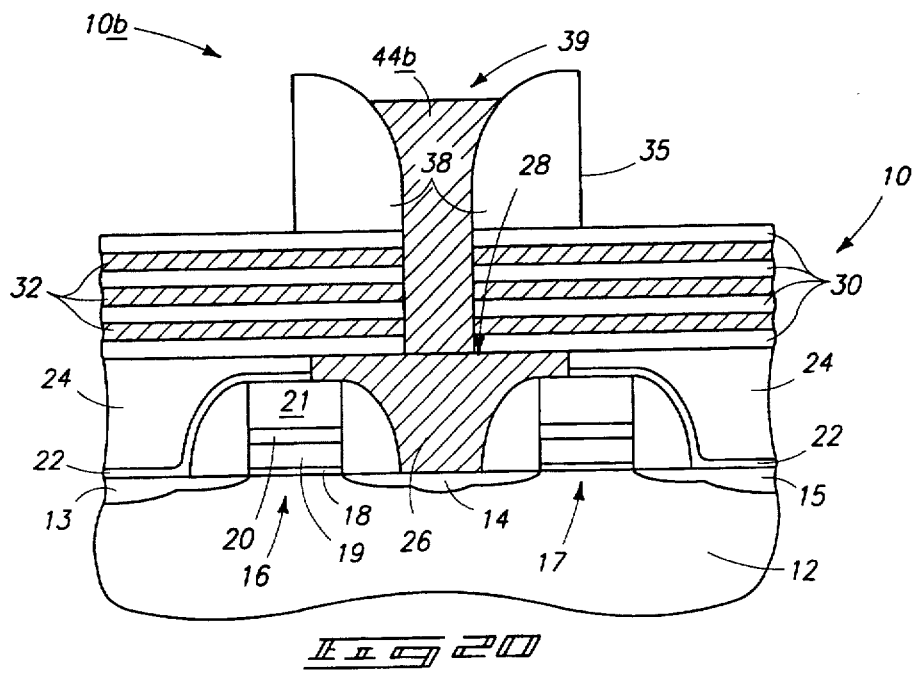

Referring to FIG. 19, a conductive plugging layer 44b is deposited. Referring to FIG. 20, layer 44b is etched or planarized back as shown, and masking layers 70 and 34 also etched. Referring to FIG. 21, layers 30 and 32 are etched to define the capacitor outline, with plugging material 44b also being etched in the process where it is provided to be the same material as layers 32. Thus in this described embodiment, the unmasked first masking layer is etched after extending the second opening to the node where in the first described embodiment it is conducted before.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising the following steps:
    providing a node to which electrical connection to a first capacitor plate is to be made;
    after providing the node, providing a finned lower capacitor plate in ohmic electrical connection with the node using no more than one photomasking step; and
    providing a capacitor dielectric layer and a conductive second capacitor plate layer over the conductive layer.

2. The method of forming a capacitor of claim 1 wherein the node comprises an outer surface of a pillar which projects from a diffusion region provided in a bulk semiconductive substrate.

3. The method of forming a capacitor of claim 1 wherein the finned lower capacitor plate constitutes the same material as that of the node.

4. A method of forming a capacitor comprising the following steps:
    providing a semiconductive substrate having an upper surface;
    providing a node over the semiconductive substrate to which electrical connection to a first capacitor plate is to be made;
    after providing the node, providing a finned lower capacitor plate in ohmic electrical connection with the node using no more than one photomasking step, said finned lower capacitor plate essentially parallel to the upper surface; and
    providing a capacitor dielectric layer and a conductive second capacitor plate layer over the conductive layer.

* * * * *

UNITED STATES PATENT AND TRADEMARK OFFICE
CERTIFICATE OF CORRECTION

PATENT NO. : 6,214,687 B1　　　　　　　　　　　　　　　　　　　　　　Page 1 of 2
DATED : April 10, 2001
INVENTOR(S) : Gurtej Sandhu, et al.

It is certified that error appears in the above-identified patent and that said Letters Patent is hereby corrected as shown below:

Please replace the drawings with the attached drawing, Fig. 20 (p. 10/12) that was submitted to the PTO by a substitute request on July 6, 2000.

Signed and Sealed this

Twenty-fifth Day of December, 2001

*Attest:*

JAMES E. ROGAN
*Attesting Officer*　　　*Director of the United States Patent and Trademark Office*

UNITED STATES PATENT AND TRADEMARK OFFICE
CERTIFICATE OF CORRECTION

PATENT NO. : 6,214,687 B1
DATED : April 10, 2001
INVENTOR(S) : Gurtej Sandhu, et al.

It is certified that error appears in the above-identified patent and that said Letters Patent is hereby corrected as shown below:

Please replace the drawings with the attached drawing, Fig. 20 (p. 10/12) that was submitted to the PTO by a substitute request on July 6, 2000.

Signed and Sealed this

Eighth Day of January, 2002

*Attest:*

*Attesting Officer*

JAMES E. ROGAN
*Director of the United States Patent and Trademark Office*